United States Patent
Endo et al.

(10) Patent No.: US 10,558,202 B2
(45) Date of Patent: Feb. 11, 2020

(54) SIGNAL TRANSMISSION CIRCUIT, FIELD DEVICE, AND PLANT CONTROL SYSTEM

(71) Applicant: Yokogawa Electric Corporation, Tokyo (JP)

(72) Inventors: Tatsuro Endo, Tokyo (JP); Masami Wada, Tokyo (JP)

(73) Assignee: Yokogawa Electric Corporation, Tokyo (JP)

( * ) Notice: Subject to any disclaimer, the term of this patent is extended or adjusted under 35 U.S.C. 154(b) by 206 days.

(21) Appl. No.: 15/659,013

(22) Filed: Jul. 25, 2017

(65) Prior Publication Data
US 2018/0039256 A1    Feb. 8, 2018

(30) Foreign Application Priority Data
Aug. 8, 2016 (JP) .................. 2016-155425

(51) Int. Cl.
| | |
|---|---|
| G05B 19/418 | (2006.01) |
| H04L 7/00 | (2006.01) |
| H03K 5/01 | (2006.01) |
| H03K 19/21 | (2006.01) |
| H03K 5/00 | (2006.01) |
| H04L 25/02 | (2006.01) |

(52) U.S. Cl.
CPC .......... *G05B 19/4183* (2013.01); *H03K 5/01* (2013.01); *H03K 19/21* (2013.01); *H04L 7/0087* (2013.01); *H04L 25/0266* (2013.01); *G05B 2219/40237* (2013.01); *H03K 2005/00013* (2013.01)

(58) Field of Classification Search
CPC ............. H03K 5/01; H03K 19/21; H03K 2005/00013; H03K 2005/00078; H03K 2005/00293; H04L 7/0075; H04L 7/0087; H04L 7/0091; H04L 7/0033; H04L 7/10; H04L 25/0266; H04L 25/0268; G05B 19/4183; G05B 2219/40237
USPC .......... 375/340, 354, 355, 360; 398/154–156, 398/200, 201, 207, 212, 214
See application file for complete search history.

(56) References Cited

U.S. PATENT DOCUMENTS

| | | | |
|---|---|---|---|
| 4,835,759 A * | 5/1989 | Saito ...................... | G11B 7/004 360/39 |
| 5,270,577 A | 12/1993 | Yamaguchi et al. | |
| 2009/0110111 A1 * | 4/2009 | Kato ................... | H04L 25/4904 375/295 |

(Continued)

FOREIGN PATENT DOCUMENTS

| | | |
|---|---|---|
| JP | S62-160852 A | 7/1987 |
| JP | 01279621 A | 9/1989 |

(Continued)

*Primary Examiner* — Young T Tse
(74) *Attorney, Agent, or Firm* — Sughrue Mion, PLLC

(57) ABSTRACT

A signal transmission circuit includes a first photocoupler to which a transmission signal is input, an edge detection circuit which is disposed in a primary side of the first photocoupler, the edge detection circuit being configured to detect a rising edge and a falling edge of the transmission signal, and an edge demodulation circuit which is disposed in a secondary side of the first photocoupler, the demodulation circuit being configured to demodulate the transmission signal by using only one of the rising edge and the falling edge of an edge detection signal output from the edge detection circuit via the first photocoupler.

18 Claims, 5 Drawing Sheets

(56) References Cited

U.S. PATENT DOCUMENTS

| | | | |
|---|---|---|---|
| 2009/0322380 A1 | 12/2009 | Yanagishima et al. | |
| 2011/0148477 A1 | 6/2011 | Teramoto et al. | |
| 2015/0063434 A1* | 3/2015 | Sonntag | H04L 27/1563 375/238 |
| 2015/0381219 A1* | 12/2015 | Kramer | H04B 1/0475 375/297 |
| 2017/0277209 A1 | 9/2017 | Kurokawa et al. | |

FOREIGN PATENT DOCUMENTS

| | | |
|---|---|---|
| JP | 03217904 A | 9/1991 |
| JP | H03-293815 A | 12/1991 |
| JP | 2010010762 A | 1/2010 |
| JP | 2011-124331 A | 6/2011 |
| JP | 2013-222978 A | 10/2013 |
| JP | 2015035725 A | 2/2015 |
| WO | 2010/061511 A1 | 6/2010 |
| WO | 2016/071962 A1 | 5/2016 |

\* cited by examiner

SIGNAL TRANSMISSION CIRCUIT, FIELD DEVICE, AND PLANT CONTROL SYSTEM

BACKGROUND

Technical Fields

The disclosure relates to a signal transmission circuit, a field device, and a plant control system.

Priority is claimed on Japanese Patent Application No. 2016-155425, filed Aug. 8, 2016, the contents of which are incorporated herein by reference.

Related Art

In a plant and a factory, a process control system is constructed, and an advanced automatic operation is implemented. In the process control system, field devices (measurement devices and manipulation devices) and a control device which controls the field devices are connected to each other. In the process control system, the field device and the control device are connected by an analog transmission line for transmitting an analog signal such as a signal of "4 to 20 [mA]", or connected by a communication bus for transmitting a digital signal called as a fieldbus.

The field devices are often configured to satisfy an intrinsically safe explosion-proof standard because the field devices may be installed in a dangerous place, such as a place where flammable gases are used. For example, in the field device connected to the fieldbus, an insulation circuit such as a photocoupler and a transformer is disposed in a signal transmission circuit for transmitting a signal. The insulation circuit electrically insulates a circuit (for example, a calculation circuit for calculating a process amount) disposed inside the field device from the outside (for example, a transmission line and a communication bus).

An example of a conventional signal transmission circuit which transmits a pulse signal via an insulation circuit is disclosed in Japanese Unexamined Patent Application Publication No. 2013-222978, Japanese Unexamined Patent Application Publication No. 2011-124331, and WO 2010/061511. For example, Japanese Unexamined Patent Publication No. 2013-222978 discloses a pulse signal output circuit including a pulse transformer, or a pulse signal output circuit including a photocoupler is disclosed. Japanese Unexamined Patent Publication No. 2011-124331 and WO 2010/061511 disclose a signal propagation circuit or a signal transmission device including a photocoupler.

Meanwhile, in the photocoupler, a propagation delay time (hereinafter, called as "rise delay time") of a rising signal and a propagation delay time (hereinafter, called as "fall delay time") of a falling signal may be different from each other. The rising signal is a signal changing from "L (low)" level to "H (high)" level, and the falling signal is a signal changing from "H" level to "L" level. Similarly, in a light emitting circuit which makes the photocoupler emit light and a light receiving circuit which processes an output signal from the photocoupler, the rise delay time and the fall delay time may be different from each other. In a case that the photocoupler is used as an insulation circuit (furthermore, in a case that the light emitting circuit and the light receiving circuit are used as a peripheral circuit of an insulation circuit), a pulse width of the signal may change.

FIG. 6 is a drawing for explaining how the pulse width of the signal changes when the signal is input to the insulation circuit. In FIG. 6, for example, the rise delay time of the insulation circuit is T, and the fall delay time of the insulation circuit is 2T. When the pulse signal S100 shown in FIG. 6 is input to the insulation circuit, the pulse signal S100 may change to the pulse signal S200 shown in FIG. 6. Specifically, the pulse signal S100 which has a length 4T in the "H" level period, a length 4T in the "L" level period, and a length 4T in the "H" level period may change to the pulse signal S200 which has a length 5T in the "H" level period, a length 3T in the "L" level period, and a length of 5T in the "H" level period. The example shown in FIG. 6 is an extreme example for explaining how the pulse width of the signal changes.

It is considered that a photocoupler which is sufficiently faster than a transmission rate may be used in order to prevent the change in the pulse width. However, since the high speed photocoupler is expensive, a cost of the signal transmission circuit rises. Furthermore, since the high-speed photocoupler has low withstand voltage in many cases, it is difficult to design the circuit.

SUMMARY

A signal transmission circuit may include a first photocoupler to which a transmission signal is input, an edge detection circuit which is disposed in a primary side of the first photocoupler, the edge detection circuit being configured to detect a rising edge and a falling edge of the transmission signal, and an edge demodulation circuit which is disposed in a secondary side of the first photocoupler, the demodulation circuit being configured to demodulate the transmission signal by using only one of the rising edge and the falling edge of an edge detection signal output from the edge detection circuit via the first photocoupler.

Further features and aspects of the present disclosure will become apparent from the following detailed description of exemplary embodiments with reference to the attached drawings.

DETAILED DESCRIPTION OF THE EMBODIMENTS

The embodiments of the present invention will be now described herein with reference to illustrative preferred embodiments. Those skilled in the art will recognize that many alternative preferred embodiments can be accomplished using the teaching of the present invention and that the present invention is not limited to the preferred embodiments illustrated herein for explanatory purposes.

An aspect of the present invention is to provide a signal transmission circuit, a field device, and a plant control system which can prevent a change in a pulse width of a signal transmitted through an insulation circuit without increasing costs.

Figure 1:
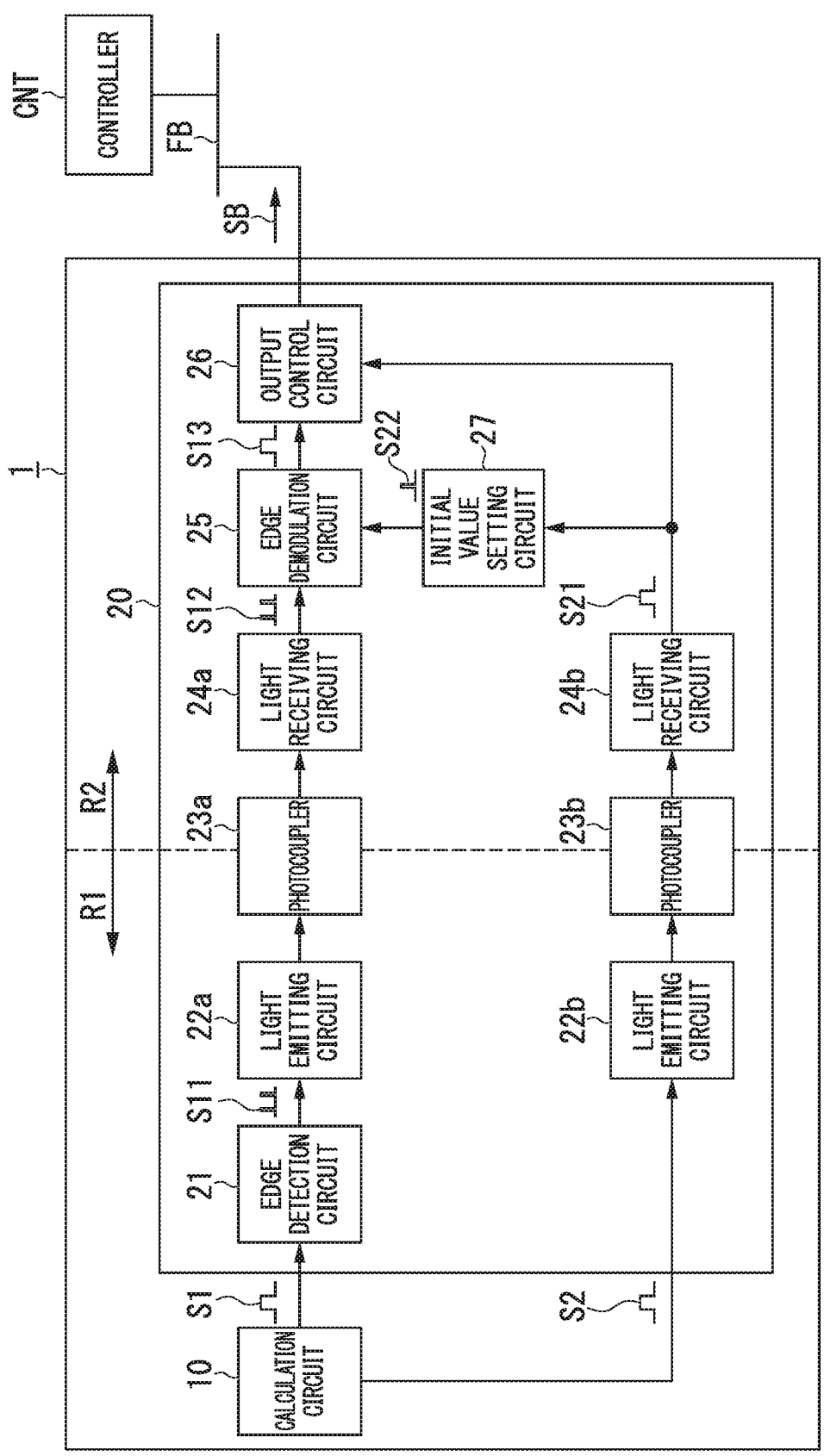
FIG. 1 is a block diagram illustrating a main configuration of a field device including a signal transmission circuit in the embodiment of the present invention.

Hereinafter, a signal transmission circuit in an embodiment of the present invention will be described in detail with reference to drawings. FIG. 1 is a block diagram illustrating a main configuration of a field device including a signal transmission circuit in the embodiment of the present invention. As shown in FIG. 1, a plant control system includes a field device 1 and a controller CNT. The field device 1 includes a calculation circuit 10 and a signal transmission circuit 20. The field device 1 is installed in a plant or a factory (hereinafter, called simply "plant" as a generic name of them), and the field device 1 transmits a bus signal SB which is a digital signal to a controller CNT through a field bus FB.

In the present embodiment, in order to be understood easily, an example where the field device 1 is a flow meter will be explained. The controller CNT performs various process controls based on the bus signal SB transmitted from the field device 1 through the field bus FB. For example, the controller CNT controls an opening of a valve (not shown) installed in the plant based on the bus signal SB transmitted from the field device 1. For example, the field bus FB is a wired communication bus installed in the plant.

Figure 3:
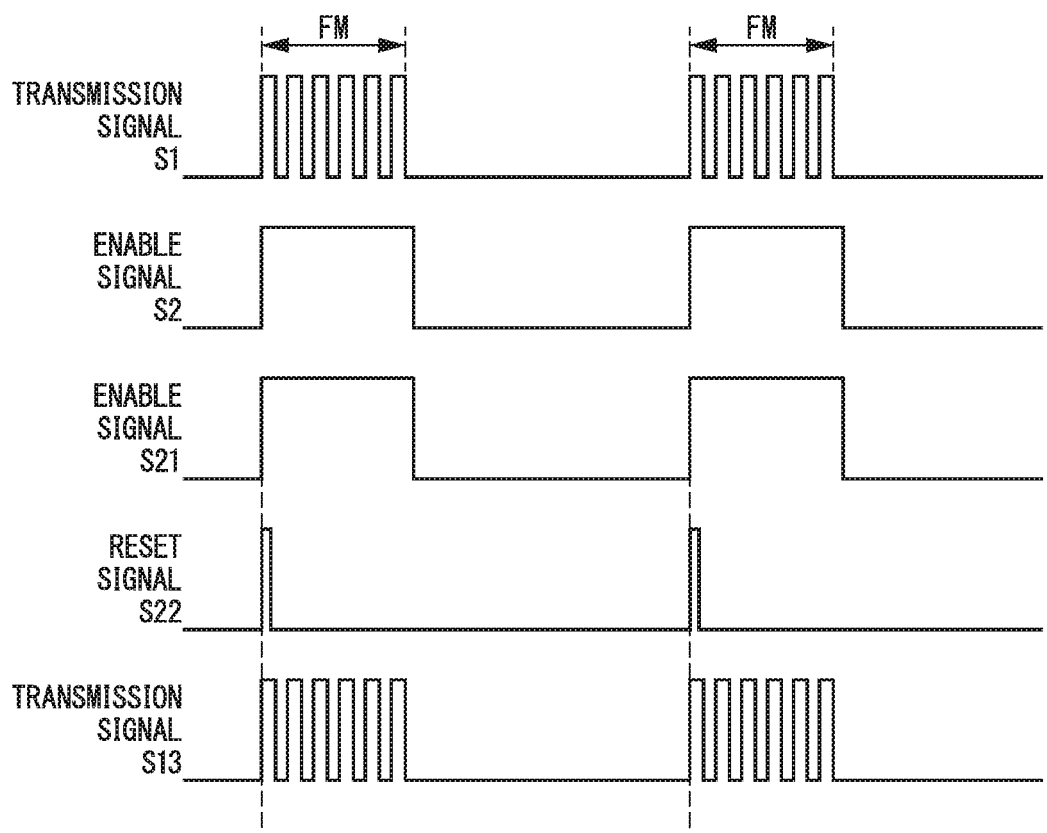
FIG. 3 is a drawing illustrating an example of a signal waveform in the signal transmission circuit in the embodiment of the present invention.

The calculation circuit 10 calculates a process value indicating a flow rate (state quantity) of fluid which is a measurement target based on a signal output from a flow rate sensor (not shown) disposed in the field device 1. The calculation circuit 10 outputs a transmission signal S1 (a digital signal which is to be transmitted) indicating the process value to the signal transmission circuit 20. Further, the calculation circuit 10 supplies, to the signal transmission circuit 20, an enable signal S2 for controlling an output of the digital signal (the bus signal SB transmitted to the controller CNT through the field bus FB) which is to be output from the field device 1. The enable signal S2 is synchronized with the transmission signal S1. As shown in FIG. 3, the enable signal S2 is the "H" level in a period (in a communication frame FM) in which the transmission signal S1 is output, and the enable signal S2 is the "L" level in a period (outside the communication frame FM) in which the transmission signal S1 is not output. For example, the calculation circuit 10 is realized by a CPU (Central Processing Unit). The signal transmission circuit 20 may be configured so that the enable signal S2 is the "L" level in a period in which the transmission signal S1 is output, and the enable signal S2 is the "H" level in a period in which the transmission signal S1 is not output.

The signal transmission circuit 20 includes an edge detection circuit 21, a light emitting circuit 22a (first light emitting circuit), a light emitting circuit 22b (second light emitting circuit), a photocoupler 23a (first photocoupler), a photocoupler 23b (second photocoupler), a light receiving circuit 24a (first light receiving circuit), a light receiving circuit 24b (second light receiving circuit), an edge demodulation circuit 25, an output control circuit 26, and an initial value setting circuit 27. The signal transmission circuit 20 is configured to satisfy an intrinsically safe explosion-proof standard, and the signal transmission circuit 20 transmits the bus signal SB based on the transmission signal S1 and the enable signal S2 output from the calculation circuit 10.

The edge detection circuit 21 detects a rising edge and a falling edge of the transmission signal S1 output from the calculation circuit 10, and the edge detection circuit 21 outputs an edge detection signal S11 indicating a detection result thereof to the light emitting circuit 22a. The edge detection circuit 21 is disposed in a primary side of the photocoupler 23a. In other words, among a light emitting element (light emitting diode) (not shown) and a light receiving element (phototransistor or photodiode) (not shown) disposed in the photocoupler 23a, the edge detection circuit 21 is disposed on a side where the light emitting element is disposed.

Figure 2:
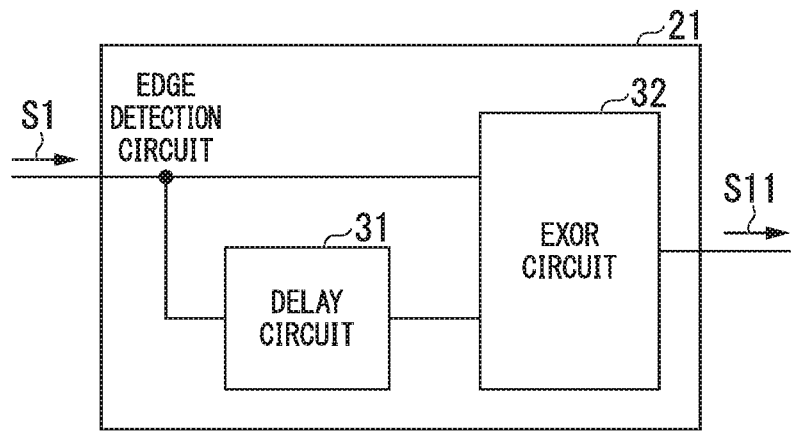
FIG. 2 is a block diagram illustrating a configuration example of an edge detection circuit disposed in the signal transmission circuit in the embodiment of the present invention.

FIG. 2 is a block diagram illustrating a configuration example of an edge detection circuit disposed in the signal transmission circuit in the embodiment of the present invention. As shown in FIG. 2, the edge detection circuit 21 includes a delay circuit 31 and an exclusive OR circuit (EXOR circuit) 32 (calculation circuit). The delay circuit 31 delays the transmission signal S1 output from the calculation circuit 10 by a predetermined time (for example, about one tenth of the pulse width of the transmission signal S1). The exclusive OR circuit 32 calculates an exclusive OR of the transmission signal S1 output from the calculation circuit 10 and the signal output from the delay circuit 31, and the exclusive OR circuit 32 outputs the calculation result as an edge detection signal S11 to the light emitting circuit 22a.

The light emitting circuit 22a is disposed between the edge detection circuit 21 and the photocoupler 23a, and the light emitting circuit 22a makes the light emitting element (not shown) disposed in the photocoupler 23a emit light based on the edge detection signal S11 output from the edge detection circuit 21. The light emitting circuit 22a is a circuit including a resistance or the like for adjusting a current flowing through the light emitting element in order to make the light emitting element (not shown) disposed in the photocoupler 23a emit light properly.

The photocoupler 23a includes the light emitting element (not shown) and the light receiving element (not shown). The photocoupler 23a is an insulation circuit which electrically insulates a primary side (a side where the light emitting element is disposed) and a secondary side (a side where the light receiving element is disposed). The light receiving circuit 24a is disposed in the secondary side of the photocoupler 23a. The light receiving circuit 24a processes the output signal (light receiving signal) output from the photocoupler 23a, and the light receiving circuit 24a outputs the edge detection signal S12 to the edge demodulation circuit 25. For example, the light receiving circuit 24a includes a resistance and a logic circuit, and performs a process such as a waveform shaping of the output signal from the photocoupler 23a.

The edge demodulation circuit 25 is disposed between the light receiving circuit 24a and the output control circuit 26. The edge demodulation circuit 25 demodulates the transmission signal S1, which is a signal to be transmitted, based on the edge detection signal S12 output from the light receiving circuit 24a. The edge demodulation circuit 25 outputs the demodulated signal to the output control circuit 26 as the transmission signal S13. Specifically, the edge demodulation circuit 25 demodulates by using only one of the rising edge and the falling edge of the edge detection signal S12 output from the light receiving circuit 24a, and the edge demodulation circuit 25 outputs the demodulated signal as a transmission signal S13 to the output control circuit 26. In the present embodiment, an example where the edge demodulation circuit 25 demodulates by using the rising edge and outputs the demodulated signal as the transmission signal S13 to the output control circuit 26 will be explained.

For example, the edge demodulation circuit 25 can be realized by a D flip-flop of edge-trigger type with reset. In a case of using the edge demodulation circuit 25, if a timing of resetting is inappropriate, the transmission signal S13 in which the logic is inverted may be output as the demodulated signal. In order to avoid this, in the present embodiment, resetting (initial value setting) of the edge demodulating circuit 25 is performed by using a reset signal S22 (details will be described later) output from the initial value setting circuit 27.

The output control circuit 26 is connected to the field bus FB. The output control circuit 26 controls an output of the bus signal SB based on an enable signal S21 (details will be described later) output from the light receiving circuit 24b. Specifically, the output control circuit 26 outputs the bus signal SB based on the transmission signal S13 when the enable signal S21 is the "H" level, and the output control circuit 26 does not output the bus signal SB when the enable signal S21 is the "L" level. The output control circuit 26 performs the control in order to prevent an erroneous transmission of the bus signal SB due to a bad influence of noise generated outside the communication frame.

The light emitting circuit 22b is the same circuit as the light emitting circuit 22a, and the light emitting circuit 22b is disposed in the primary side of the photocoupler 23b. The light emitting circuit 22b makes a light emitting element (not shown) disposed in the photocoupler 23b emit light based on the enable signal S2 output from the calculation circuit 10. Similar to the photocoupler 23a, the photocoupler 23b includes a light emitting element (light emitting diode) (not shown) and a light receiving element (phototransistor or photodiode) (not shown). The photocoupler 23b is an insulation circuit which electrically insulates the primary side (a side where the light emitting element is disposed) and the secondary side (a side where the light receiving element is disposed). The light receiving circuit 24b is the same circuit as the light receiving circuit 24a, and the light receiving circuit 24b is disposed in the secondary side of the photocoupler 23b. The light receiving circuit 24b processes the output signal output from the photocoupler 23b, and the light receiving circuit 24b outputs an enable signal S21 to the output control circuit 26 and the initial value setting circuit 27.

The initial value setting circuit 27 outputs a reset signal S22 for resetting the edge demodulation circuit 25 to the edge demodulation circuit 25 based on the enable signal S21 output from the light receiving circuit 24b. Specifically, the reset signal S22 is synchronized with the enable signal S21, the reset signal S22 becomes the "H" level for a predetermined period at a time of rising of the enable signal S21, and the reset signal S22 becomes the "L" level in the other periods.

As shown in FIG. 1, the field device 1 is divided into regions R1 and R2 which are electrically insulated by the photocouplers 23a and 23b. For example, the region R1 is a region in which a voltage of the commercial power source is permitted to be used. In the region R1, the calculation circuit 10, the edge detection circuit 21, and the light emitting circuits 22a and 22b of the signal transmission circuit 20 are arranged. On the other hand, for example, the region R2 is a region in which an allowable voltage is limited to be lower than or equal to a voltage defined by the intrinsically safe explosion-proof standard. In the region R2, the light receiving circuits 24a and 24b, the edge demodulating circuit 25, the output control circuit 26, and the initial value setting circuit 27 of the signal transmission circuit 20 are arranged.

Figure 4:
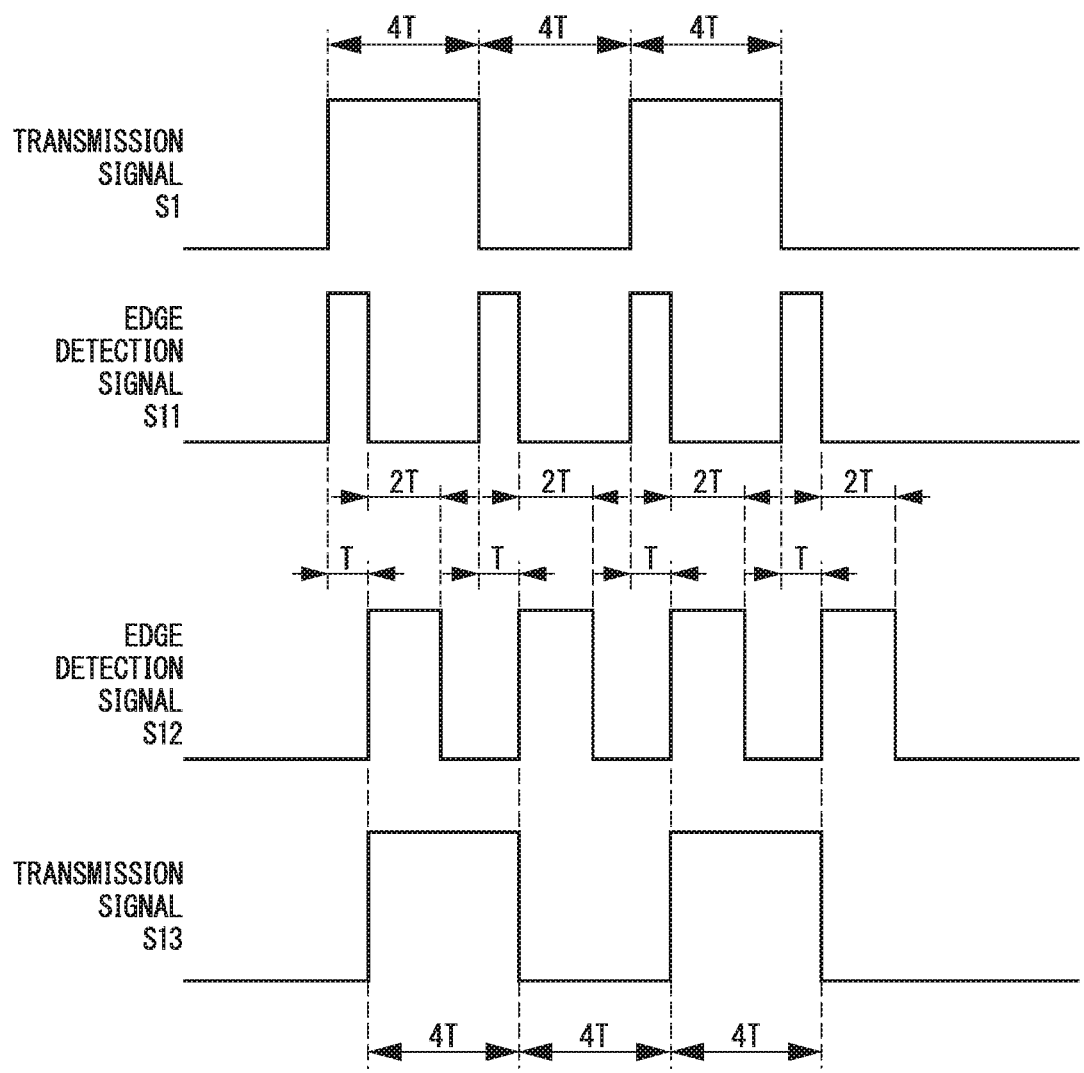
FIG. 4 is a drawing illustrating an example of a signal waveform in the signal transmission circuit in the embodiment of the present invention.
Figure 5:
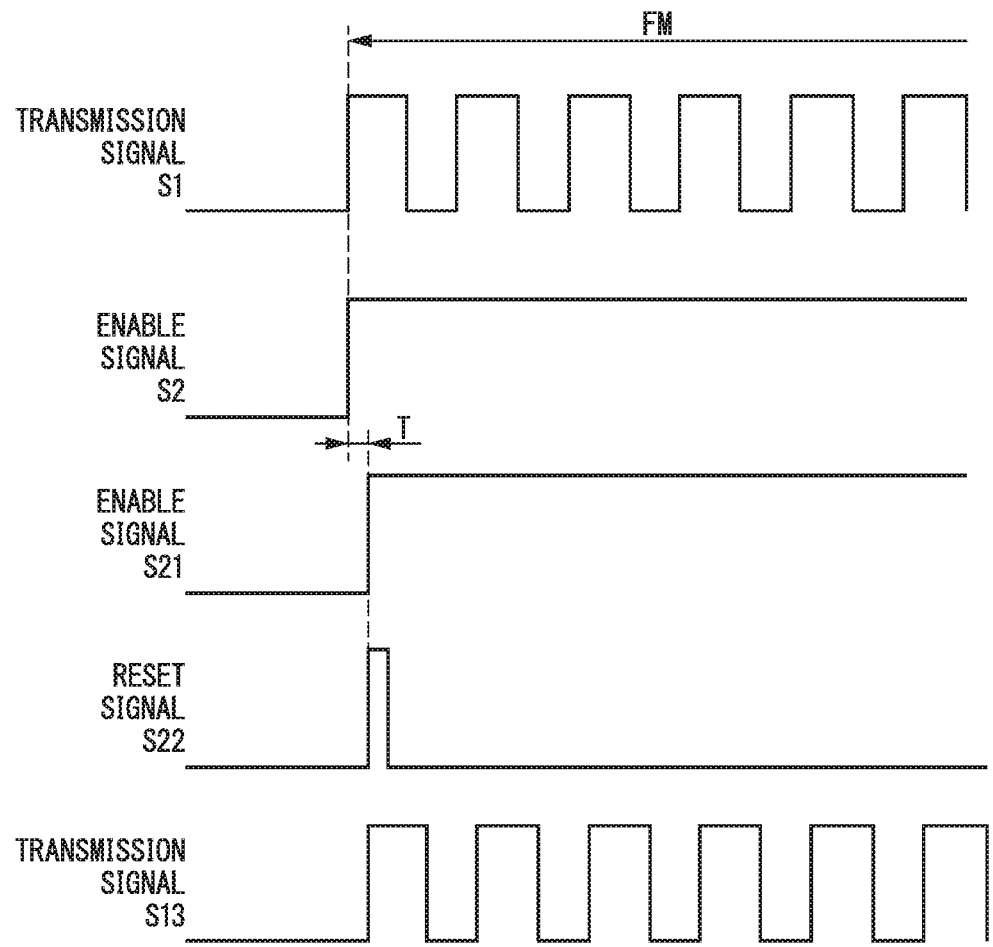
FIG. 5 is a drawing illustrating an example of a signal waveform in the signal transmission circuit in the embodiment of the present invention.
Figure 6:
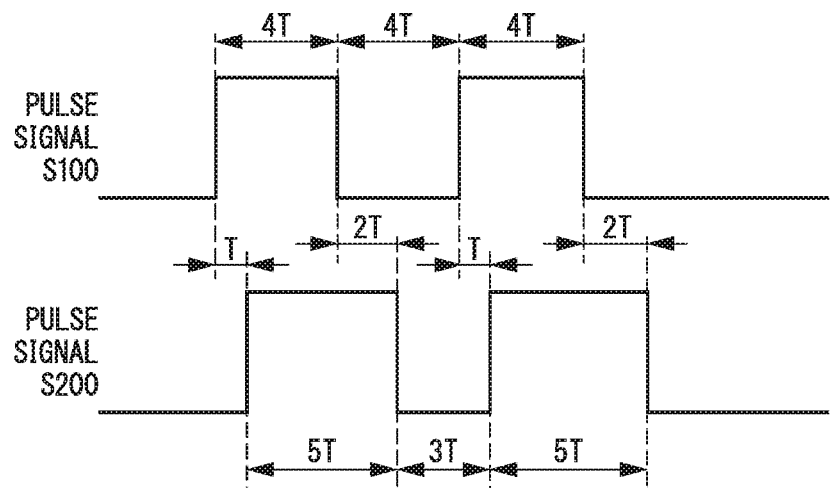
FIG. 6 is a drawing for explaining how the pulse width of the signal changes when the signal is input to the insulation circuit.

Next, an operation of the field device 1 in the above configuration will be described. FIGS. 3 to 5 are drawings illustrating an example of a signal waveform in the signal transmission circuit in the embodiment of the present invention. In the following description, in order to be understood easily, an example of measuring a flow rate of the fluid which is a measurement target at a predetermined time interval in the field device 1 will be explained. For this reason, the calculation circuit 10 disposed in the field device 1 calculates a process value indicating the flow rate of the fluid which is a measurement target at a constant time interval. As a result, as shown in FIG. 3, the calculation circuit 10 outputs the transmission signal S1 indicating the process value and the enable signal S2 at a constant interval (transmission interval of the communication frame FM).

The transmission signal S1 output from the calculation circuit 10 is input to the edge detection circuit 21 of the signal transmission circuit 20. The edge detection circuit 21 detects a rising edge and a falling edge of the transmission signal S1 input from the calculation circuit 10. As a result, as shown in FIG. 4, the edge detection circuit 21 outputs, to the light emitting circuit 22a, the edge detection signal S11 which becomes the "H" level at a time of the rising edge and the falling edge of the transmission signal S1. Here, as shown in FIG. 4, the transmission signal S1 output from the calculation circuit 10 is a pulse signal which has a length 4T in the "H" level period, a length 4T in the "L" level period, and a length 4T in the "H" level period. In this case, as shown in FIG. 4, the edge detection signal S11 output from the edge detection circuit 21 is a pulse signal which becomes "H" level for a predetermined period every time 4T.

When the edge detection signal S11 output from the edge detection circuit 21 is input to the light emitting circuit 22a, the light emitting element (not shown) disposed in the photocoupler 23a emits light in accordance with the edge detection signal S11. The light emitted from the light emitting element (not shown) disposed in the photocoupler 23a is received by the light receiving element (not shown) disposed in the photocoupler 23a, and the photocoupler 23a outputs a light reception signal. The light reception signal output from the photocoupler 23a is input to the light receiving circuit 24a. The light receiving circuit 24a processes the light reception signal input from the photocoupler 23a, and the light receiving circuit 24a outputs the edge detection signal S12 shown in FIG. 4 to the edge demodulation circuit 25.

In the example shown in FIG. 4, the rise delay time of the photocoupler 23a which is an insulation circuit is T, and the fall delay time of the photocoupler 23a is 2T. Also, the rise delay time of the photocoupler 23b is T, and the fall delay time of the photocoupler 23b is 2T. In order to describe simply, no delay occurs in the light emitting circuits 22a and 22b and the light receiving circuits 24a and 24b. Due to the delay times, as shown in FIG. 4, the timing of the rising edge of the edge detection signal S12 is delayed by the time T in comparison with the timing of the rising edge of the edge detection signal S11, and the timing of the falling edge of the edge detection signal S12 is delayed by the time 2T in comparison with the timing of the falling edge of the edge detection signal S11.

On the other hand, the enable signal S2 output from the calculation circuit 10 is input to the light emitting circuit 22b of the signal transmission circuit 20, and the light emitting element (not shown) disposed in the photocoupler 23b emits light in accordance with the enable signal S2. The light emitted from the light emitting element (not shown) disposed in the photocoupler 23b is received by the light receiving element (not shown) disposed in the photocoupler 23b, and the photocoupler 23b outputs a light reception signal. The light reception signal output from the photocoupler 23b is input to the light receiving circuit 24b. The light receiving circuit 24b processes the light reception signal input from the photocoupler 23b, and the light receiving circuit 24b outputs the enable signal S21 to the output control circuit 26 and the initial value setting circuit 27 as shown in FIG. 3.

As described above, the rise delay time of the photocoupler 23b is T. Therefore, as shown in FIG. 5, the timing of the rising edge of the enable signal S21 is delayed by the time T in comparison with the timing of the rising edge of the enable signal S2. FIG. 5 is a magnified view of a part of FIG. 3 (a beginning part of the communication frame FM).

When the enable signal S21 is input to the initial value setting circuit 27, the initial value setting circuit 27 outputs the reset signal S22 shown in FIG. 3 and FIG. 5 to the edge demodulation circuit 25. The reset signal S22 is synchronized with the enable signal S21, the reset signal S22 becomes the "H" level for a predetermined period at a time of rising of the enable signal S21, and the reset signal S22 becomes the "L" level in the other periods. When the reset signal S22 is input to the edge demodulation circuit 25, the edge demodulation circuit 25 is reset based on the reset signal S22.

As described above, the edge detection signal S12 output from the light receiving circuit 24a is also input to the edge demodulation circuit 25. As shown in FIG. 4, the edge demodulation circuit 25 demodulates by using only the rising edge of the edge detection signal S12 output from the light receiving circuit 24a, and the edge demodulation circuit 25 outputs the demodulated signal as the transmission signal S13 to the output control circuit 26. That is, the transmission signal S13 is a signal of which signal level changes every rising edge of the edge detection signal S12. As a result, as shown in FIG. 4, the demodulated transmission signal S13 becomes a pulse signal which has a length 4T in the "H" level period, a length 4T in the "L" level period, and a length 4T in the "H" level period. That is, the transmission signal S13 becomes the same pulse signal as the transmission signal S1.

The transmission signal S13 demodulated by the edge demodulation circuit 25 is input to the output control circuit 26. If the enable signal S21 output from the light receiving circuit 24b is the "H" level, the output control circuit 26 outputs the transmission signal S13 as the bus signal SB. The bus signal SB output from the output control circuit 26 is transmitted to the controller CNT through the fieldbus FB. If the enable signal S21 output from the light receiving circuit 24b is the "L" level, the output control circuit 26 does not output the bus signal SB.

As described above, in the present embodiment, the edge detection circuit 21 is disposed in the primary side of the photocoupler 23a, and detects the rising edge and the falling edge of the transmission signal S1. The edge demodulation circuit 25 is disposed in the secondary side of the photocoupler 23a, and demodulates by using only one of the rising edge and the falling edge of the edge detection signal S12 output from the edge detection circuit 21 via the photocoupler 23a to generate the transmission signal S13. Thus, it is possible to prevent a change in a pulse width of the signal transmitted via the photocoupler 23a, which is an insulation circuit, without increasing costs.

Another Embodiment

Figure 7:
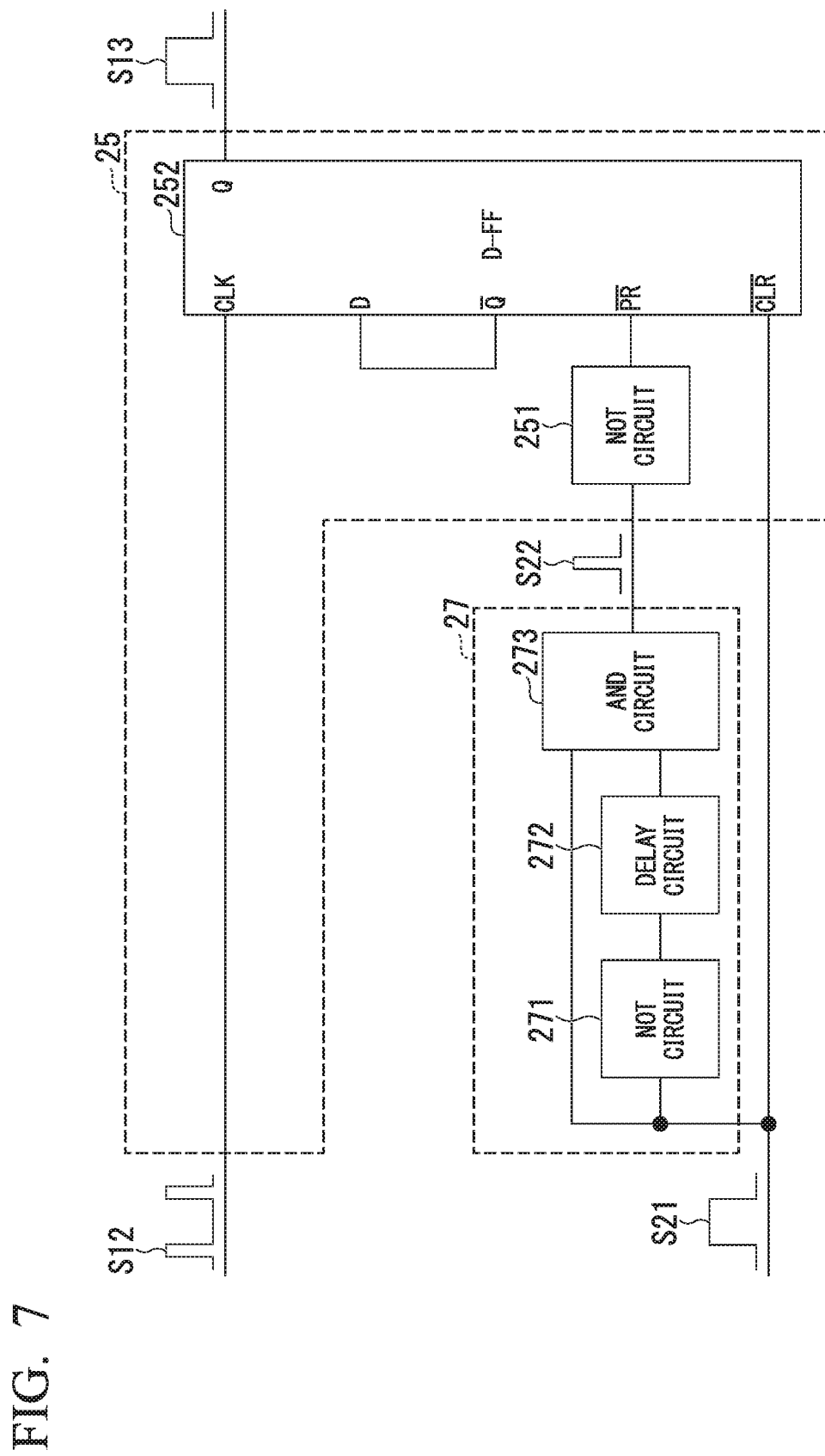
FIG. 7 is a drawing illustrating detail configurations of the edge demodulation circuit and the initial value setting circuit.

FIG. 7 is a drawing illustrating detail configurations of the edge demodulation circuit and the initial value setting circuit. As shown in FIG. 7, the initial value setting circuit 27 includes a NOT circuit 271, a delay circuit 272, and an AND circuit 273. When the enable signal S21 is input from the light receiving circuit 24b to the initial value setting circuit 27, the NOT circuit 271 inverts "L" level and "H" level of the enable signal S21. The delay circuit 272 delays the signal input from the NOT circuit 271. If both the enable signal S21 output from the light receiving circuit 24b and the signal output from the delay circuit 272 are "H" level, the AND circuit 273 outputs the reset signal S22 which is "H" level to the edge demodulation circuit 25.

The edge demodulation circuit 25 includes a NOT circuit 251 and a D-flip-flop 252. The NOT circuit 251 inverts "L" level and "H" level of the reset signal S22 output from the initial value setting circuit 27. The signal output from the NOT circuit 251 is input to the PR-bar terminal of the D-flip-flop 252. The level of the transmission signal S13 output from the Q terminal is reset based on the signal input to the PR-bar terminal. On the other hand, the enable signal S21 output from the light receiving circuit 24b is input to the CLR-bar terminal. The D terminal and the Q-bar terminal are connected to each other. For this reason, for example, if the transmission signal S13 output from the Q terminal is "H" level, the signal input to the D terminal is "L" level. The edge detection signal S12 is input from the light receiving circuit 24a to the CLK terminal. The level of the transmission signal S13 output from the Q terminal is changed every time a rising edge of the edge detection signal S12 is input to the CLK terminal. For this reason, for example, when a first rising edge of the edge detection signal S12 is input to the CLK terminal, the transmission signal S13 becomes "H" level, and when a second rising edge of the edge detection signal S12 is input to the CLK terminal, the transmission signal S13 becomes "L" level. In this way, the level of the transmission signal S13 output from the Q terminal is changed every time a rising edge of the edge detection signal S12 is input to the CLK terminal.

As described above, the D-flip-flop 252 is disposed in the edge demodulation circuit 25 so that the edge detection signal can be demodulated by simple configuration. In addition, FIG. 7 is an example, and the edge demodulation circuit 25 and the initial value setting circuit 27 are not limited to the configuration shown in FIG. 7.

Although the signal transmission circuit according to the embodiment of the present invention has been described above, the present invention is not limited to the above-described embodiments, and can be freely modified within the scope of the present invention. For example, the signal transmission circuit 20 described in the above-described embodiment transmits the digital signal to the external controller CNT through the fieldbus FB, but it is not limited thereto. For example, the signal transmission circuit 20 may receive a digital signal transmitted from the external controller CNT through the fieldbus FB. In addition, the signal transmission circuit 20 may transmit a digital signal to the external controller CNT and receive a digital signal from the external controller CNT through the fieldbus FB. That is, the signal transmission circuit 20 may be anything as long as it can transmit a signal via the photocoupler.

For example, by changing the signal transmission circuit 20 shown in FIG. 1 in accordance with the following (1) to (3), the signal transmission circuit 20 becomes possible to receive a digital signal transmitted through the fieldbus FB.

(1) Reversing the input and the output of the signal transmission circuit 20.

(2) Providing a reception circuit (a circuit for receiving a digital signal transmitted through the fieldbus FB) in a pre-stage of the edge detection circuit 21.

(3) Omitting the light emitting circuit 22b, the photocoupler 23b, the light receiving circuit 24b, the output control circuit 26, and the initial value setting circuit 27.

In the signal transmission circuit 20 having such a configuration, the digital signal transmitted through the fieldbus FB is received by the reception circuit, and a signal corresponding to the transmission signal S1 shown in FIG. 1 is output from the reception circuit. The signal output from the receiving circuit is demodulated by the circuit including the edge detecting circuit 21, the light emitting circuit 22a, the photocoupler 23a, the light receiving circuit 24a, and the edge demodulating circuit 25, and the signal is output as a signal corresponding to the transmission signal S13 shown in FIG. 1.

In the above-described embodiment, the signal is transmitted through the external fieldbus FB connected to the field device 1, but not limited thereto. For example, the present invention can also be used for transmitting and receiving signals used inside the device (for example, inside the field device 1).

In the embodiment described above, the field device 1 is a flowmeter, but it is not limited thereto. For example, the field device 1 may be a sensor device such as a temperature sensor, a valve device such as a flow rate control valve and an open/close valve, an actuator device such as a fan and a motor, an imaging device such as a camera and a video camera for photographing situations and objects in the plant, an audio device such as a microphone for collecting abnormal sound and a speaker for emitting a warning sound, a position detecting device for outputting position information of each device, or other devices.

The signal transmission circuit 20 described in the above-described embodiment transmits a digital signal to the controller CNT through the fieldbus FB which is a wired communication bus installed in a field of the plant, but not limited thereto. For example, the signal transmission circuit 20 may perform a wireless communication in conformity with industrial wireless communication standards such as ISA100.11a and WirelessHART (registered trademark) to communicate with the controller CNT.

The plant includes a petroleum refining plant, a gas producing/supplying plant, a production plant of chemistry or medicine, a plant controlling to mine a wellhead (for example, a gas field and an oil field) and controlling a transporting pipeline thereof, a power-generating plant (for example, hydro power, thermal power, nuclear power, solar power, and wind power), a monitoring control plant of water supply and sewerage, and so on.

As used herein, the following directional terms "front, back, above, downward, right, left, vertical, horizontal, below, transverse, row and column" as well as any other similar directional terms refer to those instructions of a device equipped with the present invention. Accordingly, these terms, as utilized to describe the present invention should be interpreted relative to a device equipped with the present invention.

The term "configured" is used to describe a component, unit or part of a device includes hardware and/or software that is constructed and/or programmed to carry out the desired function.

Moreover, terms that are expressed as "means-plus function" in the claims should include any structure that can be utilized to carry out the function of that part of the present invention.

The term "unit" is used to describe a component, unit or part of a hardware and/or software that is constructed and/or programmed to carry out the desired function. Typical examples of the hardware may include, but are not limited to, a device and a circuit.

While preferred embodiments of the present invention have been described and illustrated above, it should be understood that these are examples of the present invention and are not to be considered as limiting. Additions, omissions, substitutions, and other modifications can be made without departing from the scope of the present invention. Accordingly, the present invention is not to be considered as being limited by the foregoing description, and is only limited by the scope of the claims.

What is claimed is:

1. A signal transmission circuit comprising:
   a first photocoupler to which a transmission signal is input;
   an edge detection circuit which is disposed in a primary side of the first photocoupler, the edge detection circuit being configured to detect a rising edge and a falling edge of the transmission signal;
   an edge demodulation circuit which is disposed in a secondary side of the first photocoupler, the edge demodulation circuit being configured to demodulate the transmission signal by using only one of the rising edge and the falling edge of an edge detection signal output from the edge detection circuit via the first photocoupler;
   a second photocoupler to which an enable signal is input; and
   an output control circuit configured to control an output of the signal demodulated by the edge demodulation circuit based on the enable signal transmitted via the second photocoupler.

2. The signal transmission circuit according to claim 1, wherein the edge detection circuit comprises:
   a delay circuit configured to delay the transmission signal by a predetermined time; and
   an exclusive OR circuit configured to calculate an exclusive OR of the transmission signal and a signal delayed by the delay circuit.

3. The signal transmission circuit according to claim 1, further comprising:
   an initial value setting circuit configured to set an initial value of the signal demodulated by the edge demodulation circuit based on the enable signal transmitted via the second photocoupler.

4. The signal transmission circuit according to claim 3, further comprising:
   a first light emitting circuit which is disposed in the primary side of the first photocoupler;
   a second light emitting circuit which is disposed in the primary side of the second photocoupler;
   a first light receiving circuit which is disposed in the secondary side of the first photocoupler; and
   a second light receiving circuit which is disposed in the secondary side of the second photocoupler.

5. The signal transmission circuit according to claim 4,
wherein the edge detection circuit is configured to generate the edge detection signal based on the rising edge and the falling edge, and configured to output the edge detection signal to the first light emitting circuit.

6. The signal transmission circuit according to claim 5,
wherein the first light emitting circuit is configured to output, to the first light receiving circuit via the first photocoupler, the edge detection signal output from the edge detection circuit, and
wherein the first light receiving circuit is configured to output, to the edge demodulation circuit, the edge detection signal output from the first light emitting circuit via the first photocoupler.

7. The signal transmission circuit according to claim 4,
wherein the second light emitting circuit is configured to output the enable signal to the second light receiving circuit via the second photocoupler, and
wherein the second light receiving circuit is configured to output, to the output control circuit and the initial value setting circuit, the enable signal output from the second light emitting circuit via the second photocoupler.

8. The signal transmission circuit according to claim 7,
wherein the initial value setting circuit is configured to output, to the edge demodulation circuit, a reset signal which is synchronized with the enable signal output from the second light receiving circuit, and
wherein the edge demodulation circuit is configured to be reset based on the reset signal output from the initial value setting circuit.

9. A field device comprising:
a calculation circuit configured to calculate a process value indicating a state quantity of a measurement target; and
a signal transmission circuit configured to transmit a transmission signal indicating the process value calculated by the calculation circuit,
wherein the signal transmission circuit comprises:
a first photocoupler to which the transmission signal is input from the calculation circuit;
an edge detection circuit which is disposed in a primary side of the first photocoupler, the edge detection circuit being configured to detect a rising edge and a falling edge of a signal to be transmitted;
an edge demodulation circuit which is disposed in a secondary side of the first photocoupler, the edge demodulation circuit being configured to demodulate the signal to be transmitted by using only one of the rising edge and the falling edge of an edge detection signal output from the edge detection circuit via the first photocoupler;
a second photocoupler to which an enable signal is input; and
an output control circuit configured to control an output of the signal demodulated by the edge demodulation circuit based on the enable signal transmitted via the second photocoupler.

10. The field device according to claim 9,
wherein the edge detection circuit comprises:
a delay circuit configured to delay the signal to be transmitted by a predetermined time; and
an exclusive OR circuit configured to calculate an exclusive OR of the signal to be transmitted and a signal delayed by the delay circuit.

11. The field device according to claim 9,
wherein the field device is one of a flowmeter, a sensor device, a valve device, an actuator device, an imaging device, an audio device, and a position detecting device for outputting position information of each device, or other devices.

12. The field device according to claim 9, further comprising:
an initial value setting circuit configured to set an initial value of the signal demodulated by the edge demodulation circuit based on the enable signal transmitted via the second photocoupler.

13. The field device according to claim 12, further comprising:
a first light emitting circuit which is disposed in the primary side of the first photocoupler;
a second light emitting circuit which is disposed in the primary side of the second photocoupler;
a first light receiving circuit which is disposed in the secondary side of the first photocoupler; and
a second light receiving circuit which is disposed in the secondary side of the second photocoupler.

14. The field device according to claim 13,
wherein the edge detection circuit is configured to generate the edge detection signal based on the rising edge and the falling edge, and configured to output the edge detection signal to the first light emitting circuit.

15. The field device according to claim 14,
wherein the first light emitting circuit is configured to output, to the first light receiving circuit via the first photocoupler, the edge detection signal output from the edge detection circuit, and
wherein the first light receiving circuit is configured to output, to the edge demodulation circuit, the edge detection signal output from the first light emitting circuit via the first photocoupler.

16. The field device according to claim 13,
wherein the second light emitting circuit is configured to output the enable signal to the second light receiving circuit via the second photocoupler, and
wherein the second light receiving circuit is configured to output, to the output control circuit and the initial value setting circuit, the enable signal output from the second light emitting circuit via the second photocoupler.

17. The field device according to claim 16,
wherein the initial value setting circuit is configured to output, to the edge demodulation circuit, a reset signal which is synchronized with the enable signal output from the second light receiving circuit, and
wherein the edge demodulation circuit is configured to be reset based on the reset signal output from the initial value setting circuit.

18. A plant control system comprising:
a field device which is installed in a plant; and
a controller which is communicably connected to the field device, the controller being configured to control the field device,
wherein the field device comprises:
a calculation circuit configured to calculate a process value indicating a state quantity of a measurement target; and
a signal transmission circuit configured to transmit a transmission signal indicating the process value calculated by the calculation circuit,
wherein the signal transmission circuit comprises:
a first photocoupler to which the transmission signal is input from the calculation circuit;
an edge detection circuit which is disposed in a primary side of the first photocoupler, the edge detection circuit being configured to detect a rising edge and a falling edge of a signal to be transmitted;

an edge demodulation circuit which is disposed in a secondary side of the first photocoupler, the edge demodulation circuit being configured to demodulate the signal to be transmitted by using only one of the rising edge and the falling edge of an edge detection signal output from the edge detection circuit via the first photocoupler;

a second photocoupler to which an enable signal is input; and an output control circuit configured to control an output of the signal demodulated by the edge demodulation circuit based on the enable signal transmitted via the second photocoupler.

* * * * *